(12) United States Patent
Shi et al.

(10) Patent No.: US 10,872,932 B2
(45) Date of Patent: Dec. 22, 2020

(54) ORGANIC ELECTROLUMINESCENT DISPLAY SUBSTRATE, METHOD FOR MANUFACTURING THE SAME AND DISPLAY DEVICE

(71) Applicant: BOE TECHNOLOGY GROUP CO., LTD., Beijing (CN)

(72) Inventors: Ling Shi, Beijing (CN); Song Zhang, Beijing (CN); Li Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/335,567

(22) PCT Filed: Aug. 30, 2018

(86) PCT No.: PCT/CN2018/103147
§ 371 (c)(1),
(2) Date: Mar. 21, 2019

(87) PCT Pub. No.: WO2019/042340
PCT Pub. Date: Mar. 7, 2019

(65) Prior Publication Data
US 2020/0020752 A1    Jan. 16, 2020

(30) Foreign Application Priority Data
Aug. 31, 2017    (CN) .......................... 2017 1 0771029

(51) Int. Cl.
*H01L 27/32* (2006.01)
*H01L 51/52* (2006.01)
*H01L 51/56* (2006.01)

(52) U.S. Cl.
CPC ...... *H01L 27/3227* (2013.01); *H01L 27/3244* (2013.01); *H01L 51/5253* (2013.01); *H01L 51/56* (2013.01)

(58) Field of Classification Search
CPC . H01L 2251/5338; H01L 51/52; H01L 51/56; H01L 51/5253; H01L 27/3244; H01L 27/3227
See application file for complete search history.

(56) References Cited

U.S. PATENT DOCUMENTS

| 2017/0237037 A1 | 8/2017 | Choi et al. |
| 2018/0040643 A1* | 2/2018 | Lu ....................... H01L 27/1244 |

FOREIGN PATENT DOCUMENTS

| CN | 1905237 A | 1/2007 |
| CN | 101075579 A | 11/2007 |

(Continued)

OTHER PUBLICATIONS

International Search Report and Written Opinion for Application No. PCT/CN2018/103147, dated Nov. 27, 2018, 10 Pages.

*Primary Examiner* — Jasmine J Clark
(74) *Attorney, Agent, or Firm* — Brooks Kushman P.C.

(57) ABSTRACT

An organic electroluminescent display substrate including: a substrate; a display region; a transitional region; a packing film that extends from the display region to the transitional region; and a through hole. The display region includes an insulating layer on the substrate with an organic electroluminescent component thereon. The transitional region includes: a recessed portion and a redundant layer on the substrate and in the recessed portion. An opening size of one side of at least one part of the recessed portion away from the substrate is not greater than an opening size of another side of the at least one part of the recessed portion adjacent the substrate. The packing film covers the organic electroluminescent component and at least one part of the recessed portion. The through hole extends through the packing film, the redundant layer and the substrate in a region where the recessed portion is located.

20 Claims, 5 Drawing Sheets

(56) References Cited

FOREIGN PATENT DOCUMENTS

| CN | 106887523 A | 6/2017 |
| CN | 107085475 A | 8/2017 |
| CN | 107579171 A | 1/2018 |

* cited by examiner

ORGANIC ELECTROLUMINESCENT DISPLAY SUBSTRATE, METHOD FOR MANUFACTURING THE SAME AND DISPLAY DEVICE

CROSS-REFERENCE TO RELATED APPLICATIONS

This application is the U.S. national phase of PCT Application No. PCT/CN2018/103147 filed on Aug. 30, 2018, which claims priority to Chinese Patent Application No. 201710771029.3 filed on Aug. 31, 2017, which are incorporated herein by reference in their entireties.

TECHNICAL FIELD

The present disclosure relates to the field of display technologies, and in particular to an organic electroluminescent display substrate and a method for manufacturing the same and a display device.

BACKGROUND

Recently, organic light emitting diodes (OLEDs) have become a popular emerging flat panel display products at home and abroad due to their characteristics such as self-luminescence, wide viewing angle, short reaction time, high luminous efficiency, wide gamut, low operating voltage, thin panel, large-size and flexible panel and simple manufacturing process, and the potential of low cost.

One flexible OLED display device can be folded or curled like papers. After edges of the flexible display device are folded, one narrow bezel display device or even one bezel-less display device can be obtained, thereby increasing screen proportion of the display device. When the narrow bezel display device or the bezel-less display device is applied in a mobile terminal device, it is required to form an installation hole in a display region of the flexible OLED display device thereby reserving an installation position in the mobile terminal device for hardware, such as a front camera, a receiver or a Home key. However, OLED is very sensitive to water vapor and oxygen, and water and oxygen easily enter the OLED through the installation hole, resulting in a serious shortening of the product life.

SUMMARY

One embodiment of the present disclosure provides an organic electroluminescent display substrate including: a substrate; a display region; a transitional region; a packing film that extends from the display region to the transitional region and a through hole. The display region includes an insulating layer on the substrate and an organic electroluminescent component on the insulating layer. The transitional region includes: a recessed portion extending through the insulating layer and a redundant layer on the substrate and in the recessed portion. An opening size of one side of at least one part of the recessed portion away from the substrate is not greater than an opening size of another side of the at least one part of the recessed portion adjacent the substrate. The redundant layer and at least one layer of the organic electroluminescent component are made of the same material, and the redundant layer is disconnected with the organic electroluminescent component. The packing film covers the organic electroluminescent component and at least one part of the recessed portion. The through hole extends through the packing film, the redundant layer and the substrate in a region where the recessed portion is located.

Optionally, the organic electroluminescent component includes: a bottom electrode on the insulating layer, a light emitting layer on the bottom electrode, and a top electrode on the light emitting layer. The display region further includes: a thin film transistor on the substrate. The thin film transistor includes a gate electrode, a gate insulation layer covering the gate electrode, an active layer on the gate insulation layer, a source electrode and a drain electrode; and a third planarization layer that is on the gate insulation layer and covers the thin film transistor. The bottom electrode is electrically coupled with the drain electrode of the thin film transistor.

Optionally, the gate insulation layer and the third planarization layer form the insulating layer; the recessed portion is composed of a first opening in the gate insulation layer and a second opening in the third planarization layer; in a direction perpendicular to the substrate, the first opening at least partially overlaps the second opening; and an opening size of the first opening is not less than an opening size of the second opening.

Optionally, the redundant layer includes a first layer on the substrate and a second layer stacked on the first layer; the first layer and the light emitting layer are made of the same material and disconnected from each other; and the second layer and the top electrode are made of the same material and disconnected from each other.

Optionally, the through hole sequentially extends through the packing film, the second layer, the first layer and the substrate.

Optionally, the though hole is a cylindrical hole of equal diameter from bottom to up.

Optionally, the transitional region further includes: a first planarization layer filed in the recessed portion; and the first planarization layer disconnects the first layer from the light emitting layer, and disconnects the second layer from the top electrode.

Optionally, the first planarization layer covers only one portion of the second layer; the first planarization layer is provided with a transitional groove; an opening size of one side of the transitional groove away from the substrate is greater than an opening size of another side of the transitional groove adjacent the substrate; and the packing film covers the organic electroluminescent component, the first planarization layer, the transitional groove and one portion of the second layer that is not covered by the first planarization layer.

Optionally, the packing film is in direct contact with the organic electroluminescent component, the first planarization layer and one portion of the second layer that is not covered by the first planarization layer, respectively.

Optionally, the through hole extends through the whole organic electroluminescent display substrate in a region where the transitional groove is located.

Optionally, an orthographic projection of the through hole on the substrate is completely within an orthographic projection of the transitional groove on the substrate; and a boundary of the orthographic projection of the through hole on the substrate does not overlap a boundary of the orthographic projection of the transitional groove on the substrate.

Optionally, a slope degree of the first planarization layer is in a range of from 30 degrees to 90 degrees.

Optionally, the gate insulation layer is an inorganic insulation layer, and the third planarization layer is an organic insulation layer.

Optionally, the transitional region further includes: at least one notch disposed at an outer periphery of the recessed portion; wherein in a direction perpendicular to the substrate, a width of one side of at least one part of the notch away from the substrate is not greater than a width of another side of the at least one part of the notch adjacent the substrate; and a redundant layer on the substrate and in the notch; wherein the redundant layer in the notch and at least one layer of the organic electroluminescent component are made of the same material, and the redundant layer in the notch is disconnected with the organic electroluminescent component. The packing film covers the notch.

Optionally, the notch is an annular notch; and the annular notch is disposed around the outer periphery of the recessed portion.

Optionally, the transitional region further includes: a second planarization layer filed in the notch; the second planarization layer is provided with a transitional notch; the transitional notch is disposed at an outer periphery of the recessed portion; a width of one side of the transitional notch away from the substrate is greater than a width of another side of the transitional notch adjacent the substrate; and the packing film covers the transitional notch.

One embodiment of the present disclosure further provides a display device including the above organic electroluminescent display substrate.

Optionally, the display device further includes at least one of a camera, a sensor and a receiver in the through hole of the organic electroluminescent display substrate.

One embodiment of the present disclosure further provides a method for manufacturing an organic electroluminescent display substrate, including: forming an insulating layer on a substrate and forming a recessed portion in the insulating layer; wherein an opening size of one side of at least one part of the recessed portion away from the substrate is not greater than an opening size of another side of the at least one part of the recessed portion adjacent the substrate; and forming an organic electroluminescent component at the insulating layer and simultaneously forming a redundant layer on the substrate and in the recessed portion; wherein the redundant layer and at least one layer of the organic electroluminescent component are made of the same material, and the redundant layer is disconnected with the organic electroluminescent component; forming a packing film that covers the organic electroluminescent component and at least one part of the recessed portion.

Optionally, the method further includes: forming a through hole that sequentially extends through the packing film, the redundant layer and the substrate in a region where the recessed portion is located.

Optionally, before forming a packing film that covers the organic electroluminescent component and at least one part of the recessed portion, the method further includes: filing a first planarization layer in the recessed portion; wherein the first planarization layer covers only one portion of the redundant layer, and disconnects the redundant layer from the organic electroluminescent component; and forming a transitional groove in the first planarization layer; wherein an opening size of one side of the transitional groove away from the substrate is greater than an opening size of another side of the transitional groove adjacent the substrate. After forming a packing film that covers the organic electroluminescent component and at least one part of the recessed portion, the packing film covers the organic electroluminescent component, the first planarization layer, the transitional groove and one portion of the second layer that is not covered by the first planarization layer. The through hole extends through the whole organic electroluminescent display substrate in a region where the transitional groove is located.

Optionally, the forming an insulating layer on a substrate and forming a recessed portion in the insulating layer, includes: sequentially forming an inorganic insulation layer and an organic insulation layer on the substrate; exposing and developing the organic insulation layer, thereby forming a second opening in the organic insulation layer; curing the organic insulation layer; by taking the cured organic insulation layer as a barrier, removing, by dry etching, a portion of the inorganic insulation layer at a region where the second opening is located, thereby forming a first opening in the inorganic insulation layer. In a direction perpendicular to the substrate, the first opening at least partially overlaps the second opening; and an opening size of the first opening is not less than an opening size of the second opening.

BRIEF DESCRIPTION OF THE DRAWINGS

In order to illustrate technical solutions according to embodiments of the present disclosure or in the related art more clearly, drawings to be used in the description of the related art or the embodiments will be described briefly hereinafter. Apparently, the drawings described hereinafter are only some embodiments of the present disclosure, and other drawings may be obtained by those skilled in the art according to those drawings without creative work.

DETAILED DESCRIPTION

Figure 1:
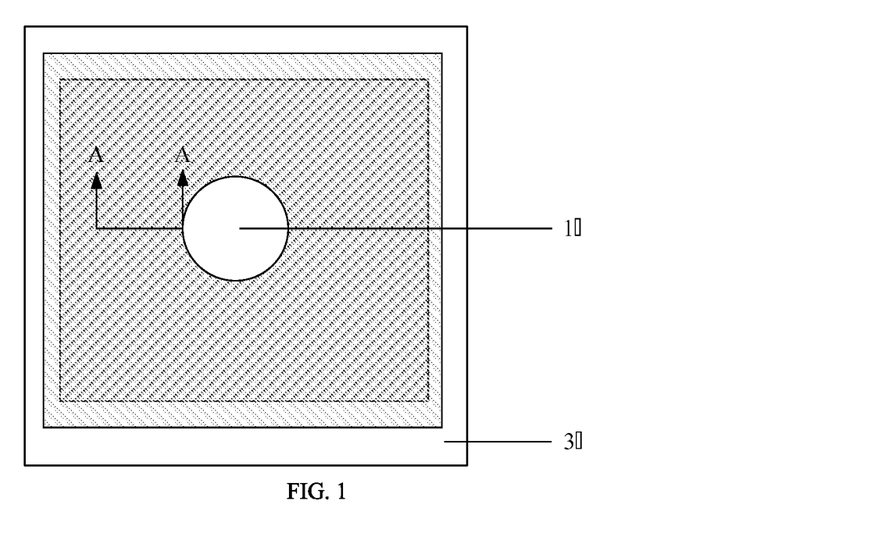
FIG. 1 is a schematic view of an organic electroluminescent display substrate in the related art.
Figure 2:
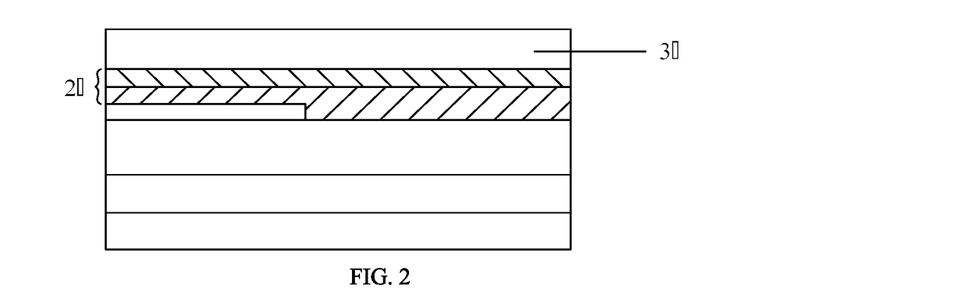
FIG. 2 is a partial sectional view of FIG. 1 taken along a line A-A.

OLED is very sensitive to water vapor and oxygen. In order to prevent water and oxygen from entering the OLED, the OLED is usually protected through a thin film package, as shown in FIG. 1 and FIG. 2. However, when it is required to form an installation hole 1' in a flexible display device, a packaging film 3' breaks at an edge of the installation hole (as shown in FIG. 1 and FIG. 2), resulting in that OLED 2' around the installation hole 1' cannot be protected by the packaging film 3', which leads to a serious shortening of the product life.

In order to solve the problems that when forming the installation hole through a whole display substrate in a display region, the packaging film breaks at the edge of the installation hole and then OLED around the installation hole cannot be protected by the packaging film, the present disclosure provides an organic electroluminescent display substrate and a method for manufacturing the same and a display device.

Specific implementation modes of the present disclosure will be described hereinafter in details in conjunction with the drawings and embodiments. The following embodiments are used to illustrate the present disclosure and not used to limit scope of the present disclosure.

Referring to FIG. 3, FIG. 4, FIG. 5 and FIG. 6, one embodiment of the present disclosure provides a method for manufacturing an organic electroluminescent display substrate. The organic electroluminescent display substrate includes a display region. The display region includes a plurality of pixel regions. Each pixel region is provided with an organic electroluminescent component.

Figure 5:
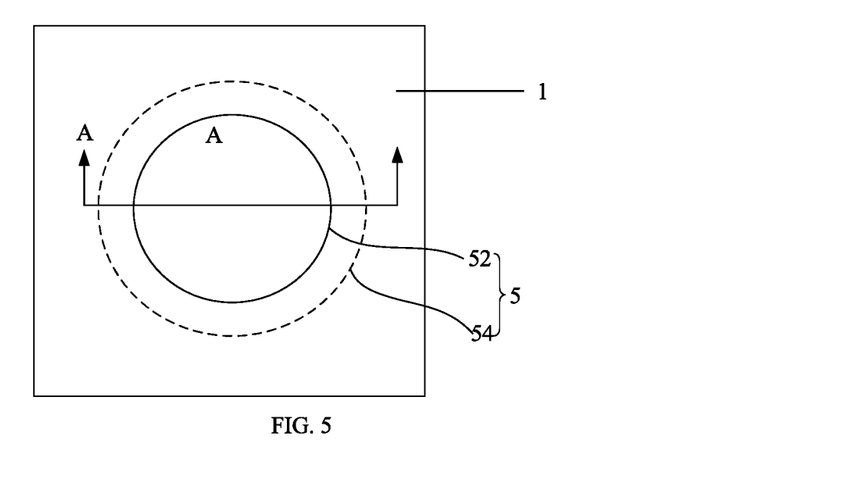
FIG. 5 is a schematic view showing a manufacturing process of the organic electroluminescent display substrate according to an embodiment of the present disclosure.
Figure 6:
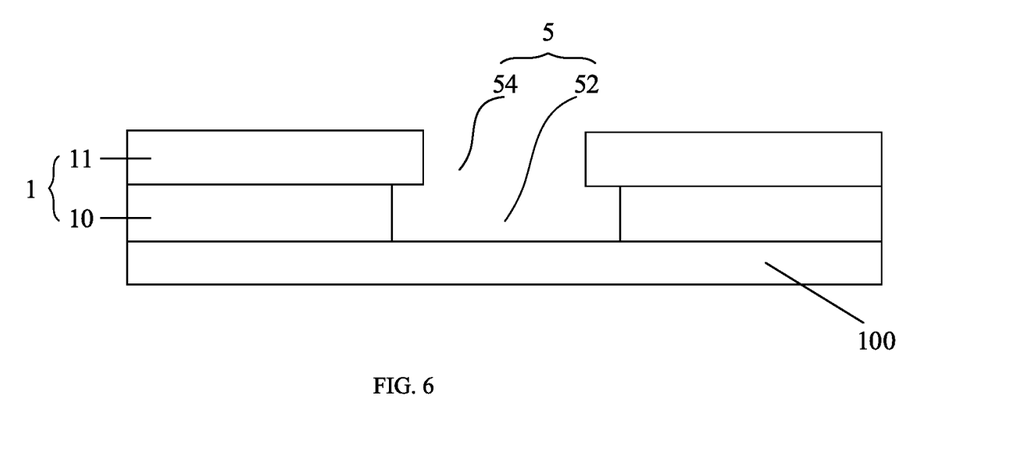
FIG. 6 is a partial sectional view of FIG. 5 taken along a line A-A.

The method includes:

forming an insulating layer 1 on a substrate 100, and forming a recessed portion 5 in the insulating layer 1; where the recessed portion 5 includes a first opening 52 adjacent the substrate 100 and a second opening 54 away from the substrate 100, and an opening size of the second opening 54 is not greater than (i.e., less than or equal to) an opening size of the first opening 52, as shown in FIG. 5 and FIG. 6;

forming the organic electroluminescent component at the substrate 100 on which the insulating layer 1 is formed, in such a manner that an orthographic projection of the entire recessed portion 5 on the substrate 100 is surrounded by an orthographic projection of the organic electroluminescent component on the substrate 100; where the organic electroluminescent component includes a first portion 2 on a surface of the insulating layer 1 away from the substrate and a second portion 4 in the recessed portion 5, and the second opening 54 of the recessed portion 5 enables the first portion 2 to be completely disconnected with the second portion 4;

forming a packing film 3 that covers the organic electroluminescent component and the recessed portion 5;

after formation of the packing film 3, forming a through hole 8 that extends through the whole organic electroluminescent display substrate in a region where the recessed portion 5 is located.

The first portion 2 of the organic electroluminescent component is an effective light emitting area, and the second portion 4 is a non-light emitting area. Thus, the first portion 2 itself may be referred as the organic electroluminescent component, while the second portion 4 may be referred as a redundant layer or a dummy layer.

In the above method, the insulating layer is first formed and then the recessed portion is formed in the insulating layer 1 before forming the organic electroluminescent component (hereinafter referred to as OLED), and the recessed portion is in a region where the OLED is located; the OLED includes the first portion on the surface of the insulating layer and the second portion in the recessed portion, the first portion is an effective light emitting area of the OLED, and the second portion is the non-light emitting area. By controlling at least one part of the recessed portion to have a shape that is smaller in top and larger in bottom, the first portion is completely disconnected with the second portion so that the water and oxygen cannot enter the first portion through the second portion. When forming the through hole 8 that extends through the whole organic electroluminescent display substrate in the region where the recessed portion is located, the packing film that covers the OLED and the recessed portion, and the second portion 4 which is a redundant layer or a dummy layer, can block the water and oxygen from entering the first portion of the OLED from a lateral side of the OLED, thereby extending service life.

Figure 3:
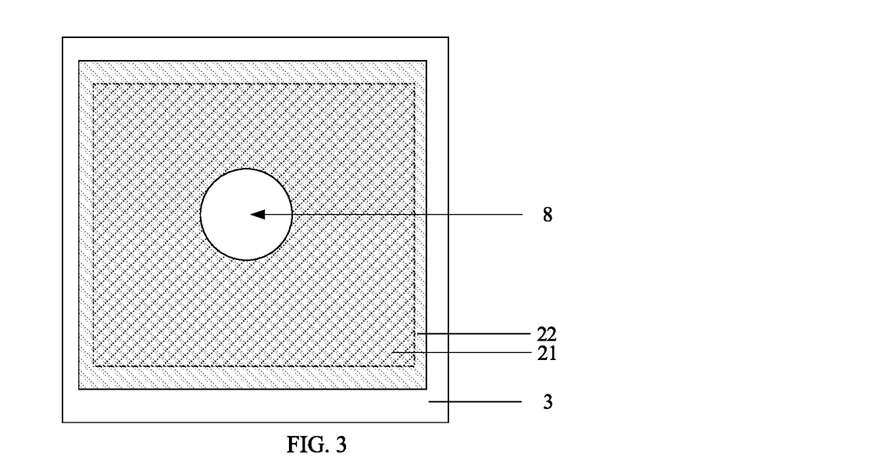
FIG. 3 is a schematic view of an organic electroluminescent display substrate according to an embodiment of the present disclosure.

The though hole 8 may be used to mount hardware, such as a camera, a receiver or a Home key. In one embodiment, the though hole 8 may extend through the organic electroluminescent display substrate in the recessed portion 5. In actual production, the though hole may be formed by means of laser drilling and extends through the packing film 3, the second portion 4 which is a redundant layer or a dummy layer, and the substrate 100. In one embodiment, as shown in FIG. 3, the though hole 8 may be a cylindrical hole of equal diameter from bottom to up.

Figure 4:
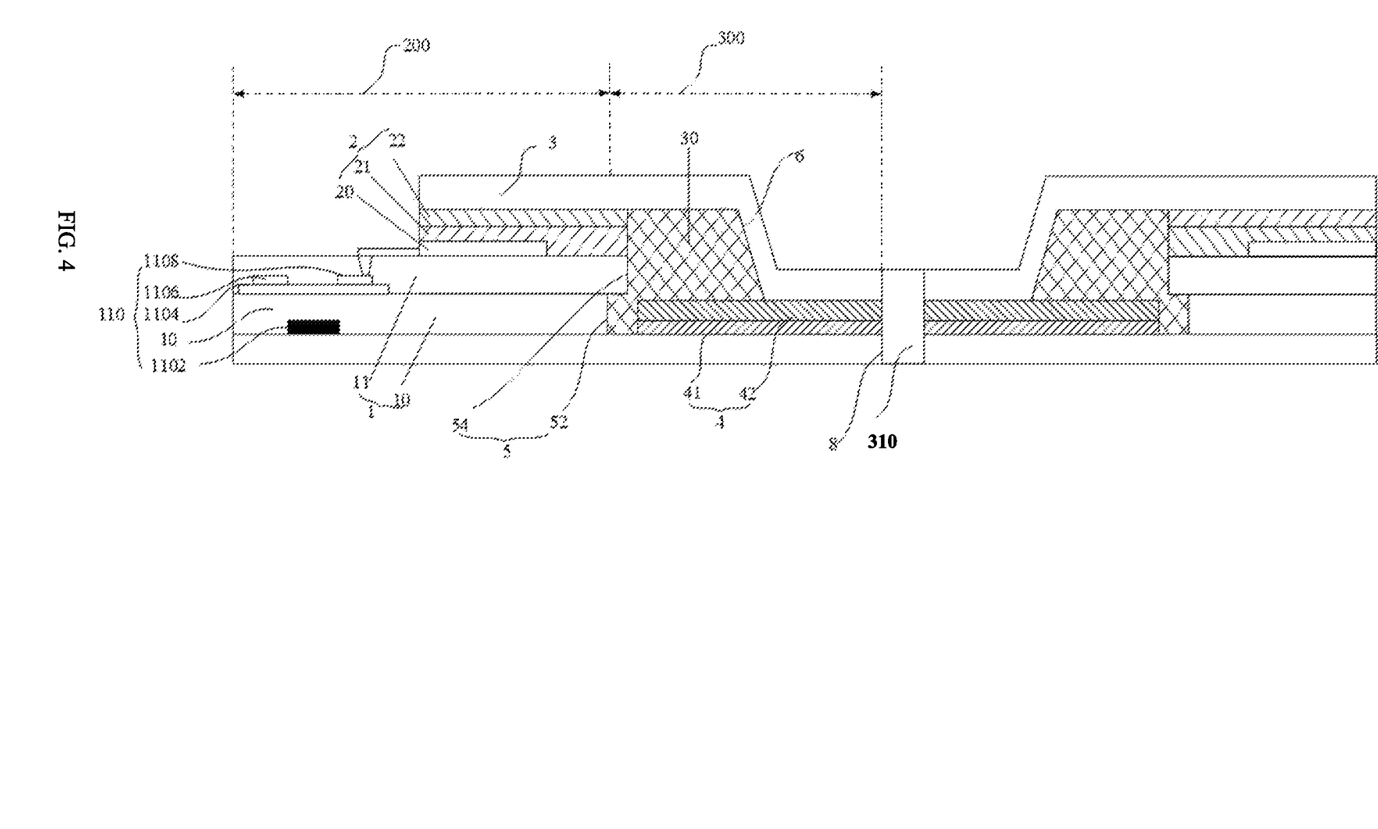
FIG. 4 is a schematic sectional view of the organic electroluminescent display substrate according to an embodiment of the present disclosure.

The second portion 4 of the OLED may include all film layers of the OLED, that is, all film layers of the OLED break at a wall of the hole in the recessed portion. The second portion 4 of the OLED may also include some film layers (such as a third sub-portion of a light emitting layer and a fourth sub-portion of a top electrode, that are in the recessed portion 5, as shown in FIG. 4 and FIG. 5) of the OLED, that is, only some film layers of the OLED break at the wall of the hole in the recessed portion. Specifically, it is determined by the position of the recessed portion and the structure of the OLED which is not limited herein.

At least the light emitting layer and one metal electrode (i.e., cathode or anode) of the OLED are required to break at the wall of the hole in the recessed portion. The orthographic projection of the entire recessed portion on the substrate is surrounded by an orthographic projection of the light emitting layer and the metal electrode on the substrate. Then, the packing film that covers the OLED and the recessed portion, and disconnection of the OLED at the recessed portion can block the water and oxygen from entering a first sub-portion 21 in the effective light emitting area of the light emitting layer and a second sub-portion 22 in the effective light emitting area of the metal electrode from the lateral side of the OLED, thereby protecting the effective light emitting area of the OLED and extending the service life.

It should be noted that, the term "top" herein refers to one side of one film away from the substrate, and the term "bottom" herein refers to one side of one film adjacent the substrate.

Figure 9:
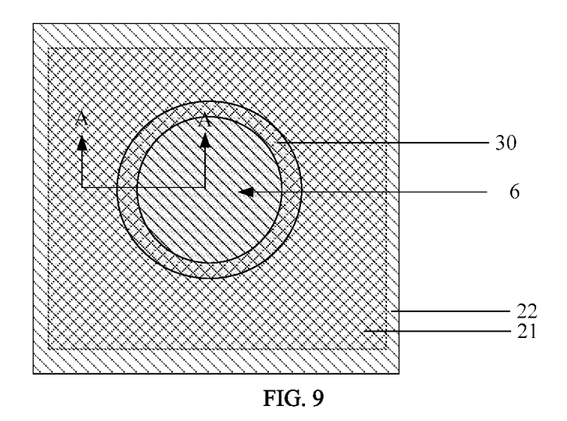
FIG. 9 is a schematic view showing a manufacturing process of the organic electroluminescent display substrate according to an embodiment of the present disclosure.
Figure 10:
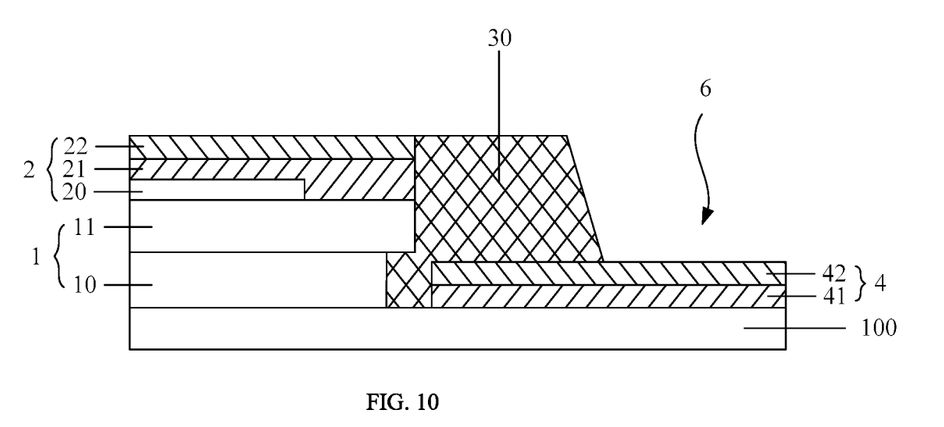
FIG. 10 is a partial sectional view of FIG. 9 taken along a line A-A.

In order to facilitate realization of covering the recessed portion in the insulating layer with the packing film, in one embodiment, referring to FIG. 9 and FIG. 10, before forming the packing film at one side of the organic electroluminescent component away from the substrate and a lateral wall of the recessed portion, the method further includes: filing a first planarization layer 30 in the recessed portion 5; and, forming a transitional groove 6 in the first planarization layer 30, where the through hole 8 is in a region where the transitional groove 6 is located and an opening size of one side of the transitional groove 6 away from the substrate 100 is greater than an opening size of another side of the transitional groove 6 adjacent the substrate 100.

Then, the packing film 3 covers the transitional groove 6, thereby covering the recessed portion 5, as shown in FIG. 4 and FIG. 10.

In the above steps, by filing the first planarization layer 30 in the recessed portion 5 and forming the transitional groove 6 which is larger in top and smaller in bottom in the first planarization layer 30, the packing film 3 covers a lateral wall of the transitional groove 6, thereby covering the recessed portion 5 with the packing film 3. Meanwhile, the presence of the transitional groove 6 can prevent the packing film from being broken, thereby maintaining integrity of the packaging film and improving the packaging effect.

In one embodiment of the present disclosure, before formation of the OLED, the insulating layer is formed and then the recessed portion is formed in the insulating layer at the region corresponding to the region where the OLED is located, and at least one part of the recessed portion has a shape that is smaller in top and larger in bottom, so as to enable the OLED to break at the wall of the hole in the recessed portion. When forming the through hole that extends through the whole substrate in the region where the recessed portion is located, the packing film that covers the recessed portion, and the second portion which is a redundant layer or a dummy layer, can block the water and oxygen from entering the first portion at the surface of the insulating layer from the lateral side of the OLED.

In one specific embodiment, referring to FIG. 5 and FIG. 6, in order to form the recessed portion 5 having the above shape in the insulating layer 1, the insulating layer 1 may be a composite structure including an inorganic insulation layer 10 and an organic insulation layer 11, then the step of forming the insulating layer 1 includes: sequentially forming the inorganic insulation layer 10 and the organic insulation layer 11.

Accordingly, the step of forming a recessed portion 5 in the insulating layer 1 includes: forming a first opening 52 in the inorganic insulation layer 10; and forming a second opening 54 in the organic insulation layer 11. The recessed portion 5 is composed of the first opening 52 and the second opening 54, and the first opening 52 and the second opening 54 are corresponding to each other in their positions. An opening size of the second opening 54 is not greater than (i.e., less than or equal to) an opening size of the first opening 52.

The recessed portion 5 prepared by the above method is composed of the first opening 52 and the second opening 54, and the first opening 52 and the second opening 54 are corresponding to each other in their positions; since an etching rate of the inorganic insulation layer is different from an etching rate of the organic insulation layer, the opening size of the first opening in the inorganic insulation layer located below is not less than the opening size of the second opening. Thus, when forming the OLED at the substrate on which the insulating layer is formed, the OLED includes the first portion on the surface of the insulating layer away from the substrate and the second portion at a bottom of the recessed portion, and the recessed portion enables the first portion to be completely disconnected with the second portion.

The step of forming the first opening in the inorganic insulation layer and forming the second opening in the organic insulation layer specifically includes:

exposing and developing the organic insulation layer, thereby forming a pattern of the organic insulation layer with the second opening;

curing the organic insulation layer;

by taking the cured organic insulation layer as a barrier, removing, by dry etching, a portion of the inorganic insulation layer at a region where the second opening is located, thereby forming the first opening in the inorganic insulation layer; where the first opening and the second opening are corresponding to each other in their positions and the opening size of the first opening is not less than the opening size of the second opening.

In the above step, the recessed portion that extends through the inorganic insulation layer and the organic insulation layer, is formed by one photolithography process. Further, in the etching process, since the etching rate of the inorganic insulation layer is different from the etching rate of the organic insulation layer, the opening size of the first opening in the inorganic insulation layer located below is not less than the opening size of the second opening.

Further, a thickness of the inorganic insulation layer in a direction perpendicular to the substrate is in a range of from 1 um to 1.5 um, so that a depth of the first opening can ensure that the first portion of the OLED is completely disconnected with the second portion.

In this embodiment, in order to simplify the manufacturing process, the insulating layer reuses an existing insulation structure of the organic electroluminescent display substrate. In some embodiments, the insulating layer may be a single-layer insulation layer.

By taking an active matrix organic electroluminescent display substrate as an example, the method further includes: forming a thin film transistor in each pixel region; where the step of forming a thin film transistor includes a step of forming a gate insulating layer; and forming a third planarization layer that covers the thin film transistor.

Then, the insulating layer may be composed of the gate insulating layer and the third planarization layer. In other words, the inorganic insulation layer is the gate insulating layer, and the organic insulation layer is the third planarization layer. After formation of the third planarization layer, the method further includes a step of forming the recessed portion that extends through the third planarization layer and the gate insulating layer. The recessed portion is composed of the first opening in the gate insulating layer and the second opening in the third planarization layer. The opening size of the first opening is not less than the opening size of the second opening.

For the active matrix organic electroluminescent display substrate, the step of forming the OLED includes: forming a bottom electrode, a top electrode on one side of the bottom electrode away from the substrate, and a light emitting layer between the bottom electrode and the top electrode. The bottom electrode is electrically coupled with a drain electrode of a corresponding thin film transistor.

The orthographic projection of the recessed portion on the substrate is surrounded by an orthographic projection of the top electrode and the light emitting layer of the organic electroluminescent component on the substrate. That is, the top electrode and the light emitting layer break at a wall of the hole in the recessed portion. The first portion of the OLED includes a first sub-portion of the light emitting layer on the surface of the insulating layer away from the substrate and a second sub-portion of the top electrode on the surface of the insulating layer away from the substrate. Then, when forming the through hole that extends through the whole display substrate in the region where the recessed portion is located, the packing film that covers the recessed portion, can block the water and oxygen from entering the first sub-portion in the effective light emitting area of the light emitting layer and the second sub-portion in the effective light emitting area of the top electrode, thereby ensuring performance of the device. The above technical solution is especially suitable for a bottom-emission organic electroluminescent display substrate with a bottom electrode which is made of metal material and which is a plate electrode covering the entire display substrate, as the metal material is easily corroded by water and oxygen and the above technical solution can avoid the problem that the bottom electrode is corroded by water and oxygen due to the presence of the through hole.

It should be noted that the above description merely takes the active matrix organic electroluminescent display substrate as an example to specifically explain how the insulating layer required by the present disclosure reuses the existing insulation structure in the organic electroluminescent display substrate, and the technical solution of the present disclosure is not limited to be only applicable to the active organic electroluminescent display substrate.

Figure 11:
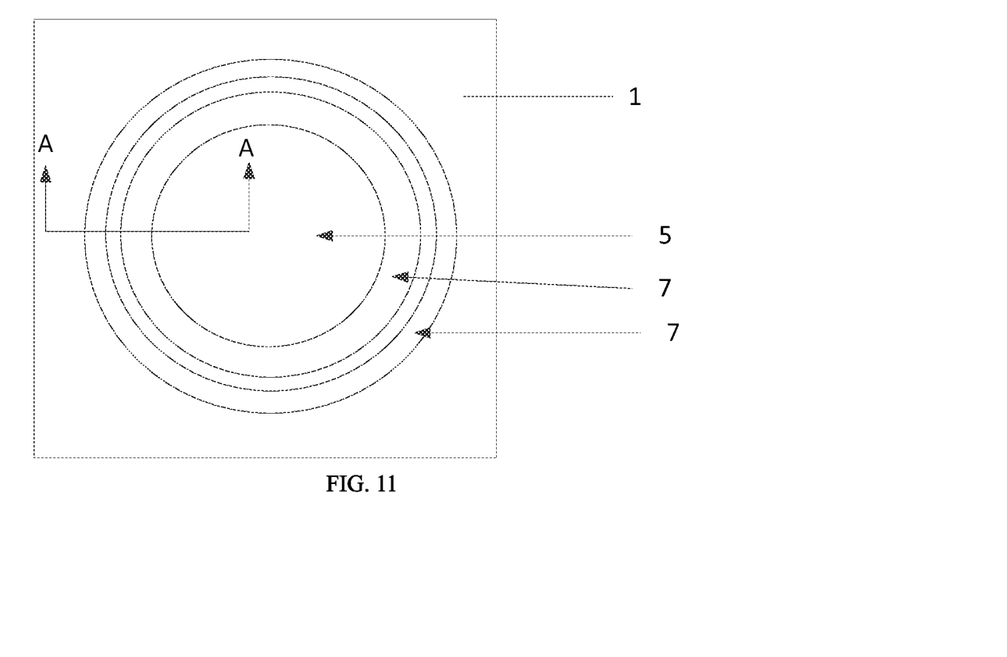
FIG. 11 is a schematic view showing an annular notch around a periphery of a recessed portion in an insulating layer according to an embodiment of the present disclosure.
Figure 12:
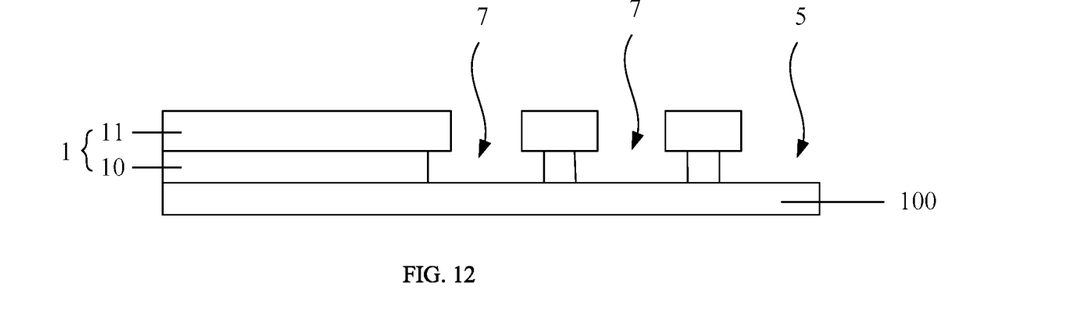
FIG. 12 is a partial sectional view of FIG. 11 taken along a line A-A.

In order to improve effect of blocking water and oxygen, in one embodiment, as shown in FIG. 11 and FIG. 12, the method for manufacturing the organic electroluminescent display substrate further includes: forming at least one notch 7 in the insulating layer 1. The notch 7 is disposed at an outer periphery of the recessed portion 5. In the direction perpendicular to the substrate 100, a width of one side of at least one part of the notch 7 away from the substrate 100 is not greater than a width of another side of the at least one part of the notch 7 adjacent the substrate 100. The organic electroluminescent component further includes a third portion in the notch 7. The at least one part of the notch 7 enables the first portion of the OLED to be completely disconnected with the third portion.

Then the packing film further covers the notch 7.

In one embodiment, the third portion may be disposed in the notch 7 in the same manner as the second portion 4 shown in FIG. 4 is disposed in the recessed portion 5. The packing film may also cover the notch in the same manner as the packing film shown in FIG. 4 covers the recessed portion. In one embodiment shown in FIG. 11 and FIG. 12, the notch 7 may be an annular notch. The annular notch may be disposed around a periphery of the recessed portion 5.

Through the above steps, the OLED is disconnected by setting at least one annular notch around the outer periphery of the recessed portion and setting at least one part of the notch having a shape that is smaller in top and larger in bottom. Then, the packing film that covers the notch and the recessed portion, can form several blocking structures, thereby effectively blocking the water and oxygen from entering the first portion from one lateral side of the OLED. Since the first portion is the effective light emitting area, the purpose for preventing the performance of the OLED to be affected by the water and oxygen can be achieved.

Further, in order to facilitate realization of covering the notch with the packing film, the method further includes: filing a second planarization layer in the notch; forming a transitional notch in the second planarization layer in such a manner that a width of one side of the transitional notch away from the substrate is greater than a width of another side of the transitional notch adjacent the substrate.

The packing film specifically covers the transitional notch, thereby covering the notch.

In the above step, by filing the planarization layer in the notch and forming the transitional notch which is larger in top and smaller in bottom in the planarization layer, the packing film covers a lateral wall of the transitional notch, thereby covering the notch with the packing film. Specific structure is the same as filling the first planarization layer in the recessed portion and forming the transitional groove in the first planarization layer, and is not shown in the drawings.

The first planarization layer covering the recessed portion, and the second planarization layer covering the notch may be an identical planarization layer, thereby simplifying the manufacturing process.

Figure 7:
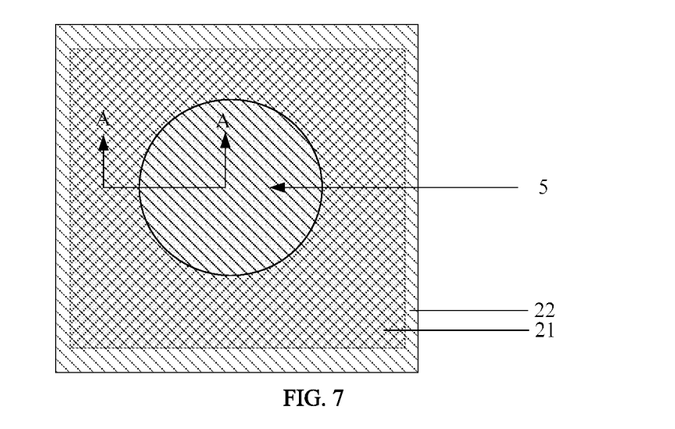
FIG. 7 is a schematic view showing a manufacturing process of the organic electroluminescent display substrate according to an embodiment of the present disclosure.
Figure 8:
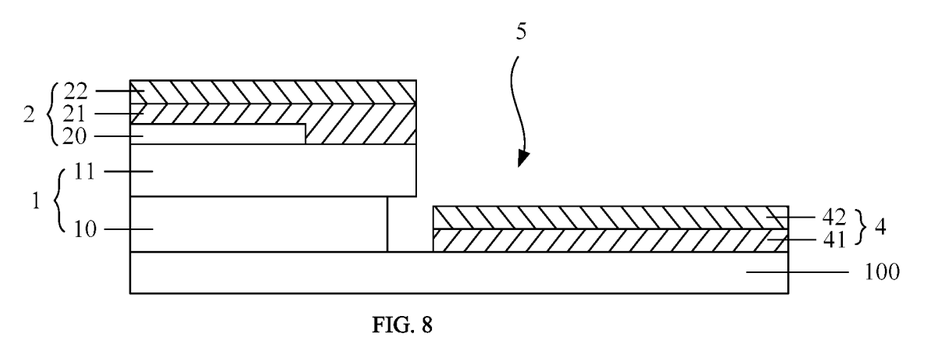
FIG. 8 is a partial sectional view of FIG. 7 taken along a line A-A.

Referring to FIG. 3 to FIG. 8, by taking the active matrix organic electroluminescent display substrate as an example, the method according to one embodiment specifically includes:

providing a substrate 100;

forming thin film transistors (not shown) on the substrate 100; where each pixel region of the active matrix organic electroluminescent display substrate is provided with the thin film transistor, and the step of forming thin film transistors includes forming a gate electrode, a gate insulation layer 10, an active layer, a source electrode and a drain electrode;

forming a third planarization layer 11 that covers the thin film transistors;

forming a recessed portion 5 that extends through the third planarization layer 11 and the gate insulation layer 10; where the recessed portion 5 is composed of a first opening in the gate insulation layer 10 and a second opening in the third planarization layer 11, the first opening and the second opening are corresponding to each other in their positions, and an opening size of the first opening is greater than an opening size of the second opening, as shown in FIG. 5 and FIG. 6;

forming an OLED at the third planarization layer 11; where each pixel region of the active matrix organic electroluminescent display substrate is provided with the OLED, and the step of forming the OLED includes: forming a bottom electrode 20 on the third planarization layer 11, forming a light emitting layer on the bottom electrode 20, forming a top electrode on the light emitting layer; the bottom electrode 20 is electrically coupled with the drain electrode of the thin film transistor; an orthographic projection of the entire recessed portion 5 on the substrate 100 is surrounded by an orthographic projection of the light emitting layer and the cathode of the OLED on the substrate 100, i.e., the light emitting layer and the cathode of the OLED break at a wall of a hole in the recessed portion; a first portion 2 of the OLED on a surface of the insulating layer 1 away from the substrate 100 includes the bottom electrode 20, a first sub-portion 21 of the light emitting layer on the surface of the insulating layer 1 away from the substrate 100 and a second sub-portion 22 of the top electrode on the surface of the insulating layer 1 away from the substrate 100; a second portion 4 of the OLED in the recessed portion includes a third sub-portion 41 of the light emitting layer on the surface of the insulating layer 1 away from the substrate 100 and a fourth sub-portion 42 of the top electrode on the surface of the insulating layer 1 away from the substrate 100, as shown in FIG. 7 and FIG. 8;

filing a first planarization layer 30 in the recessed portion and forming a transitional groove 6 in the first planarization layer; where an opening size of one side of the transitional groove 6 away from the substrate 100 is greater than an opening size of another side of the transitional groove 6 adjacent the substrate 100, as shown in FIG. 9 and FIG. 10;

forming a packing film 3 covering the OLED and the transitional groove; after formation of the packing film 3, forming a through hole 8 that extends through the whole organic electroluminescent display substrate in a region corresponding to the transitional groove, as shown in FIG. 3 and FIG. 4.

To this point, the fabrication of the active matrix organic electroluminescent display substrate is completed. The though hole may be used to mount hardware, such as a camera, a receiver or a Home key. Disconnection of the OLED at the recessed portion and the packing film covering the transitional groove can block the water and oxygen from entering the effective light emitting area from the lateral side of the OLED, thereby extending the service life.

The thin film transistor of the active matrix organic electroluminescent display substrate may be top-gate thin film transistor, a bottom-gate thin film transistor or a coplanar thin film transistor.

Referring to FIG. 3 to FIG. 6, one embodiment provides an organic electroluminescent display substrate. The organic electroluminescent display substrate includes a display region. The display region includes a plurality of pixel regions. Each pixel region is provided with an organic electroluminescent component.

The organic electroluminescent display substrate further includes:

an insulating layer 1 on a substrate 100; where the insulating layer 1 is provided with a recessed portion 5, an opening size of one side of at least one part of the recessed portion 5 away from the substrate 100 is not greater than an opening size of another side of the at least one part of the recessed portion 5 adjacent the substrate 100, the organic electroluminescent component includes a first portion 2 on a surface of the insulating layer 1 away from the substrate 100 and a second portion 4 in the recessed portion 5, and an orthographic projection of the entire recessed portion 5 on the substrate 100 is surrounded by an orthographic projection of the organic electroluminescent component on the substrate 100, and the at least one part of the recessed portion 5 enables the first portion 2 to be completely disconnected with the second portion 4;

a packing film 3 that covers the organic electroluminescent component and the recessed portion 5;

a through hole 8 that extends through the whole organic electroluminescent display substrate in a region where the recessed portion 5 is located.

In the above organic electroluminescent display substrate, the recessed portion is formed in the insulating layer that is below the OLED, and the recessed portion is in a region where the OLED is located; the OLED includes the first portion on the surface of the insulating layer and the second portion in the recessed portion, the first portion is an effective light emitting area of the OLED, and the second portion is the non-light emitting area. By controlling at least one part of the recessed portion to have a shape that is smaller in top and larger in bottom, the first portion is completely disconnected with the second portion so that the water and oxygen cannot enter the first portion through the second portion. When forming the through hole that extends through the whole organic electroluminescent display substrate in the region where the recessed portion is located, the packing film that covers the OLED and the recessed portion, can block the water and oxygen from entering the first portion of the OLED from a lateral side of the OLED, thereby extending service life.

In order to facilitate realization of covering the recessed portion in the insulating layer with the packing film, in one embodiment, referring to FIG. 9 and FIG. 10, the organic electroluminescent display substrate further includes a first planarization layer 30 in the recessed portion 5. A transitional groove 6 is provided in the first planarization layer 30. The through hole is in a region where the transitional groove 6 is located and an opening size of one side of the transitional groove 6 away from the substrate 100 is greater than an opening size of another side of the transitional groove 6 adjacent the substrate 100.

Then, the packing film 3 covers the transitional groove 6, thereby covering the recessed portion.

In the above technical solution, by filing the planarization layer in the recessed portion and forming the transitional groove which is larger in top and smaller in bottom in the planarization layer, the packing film covers a lateral wall of the transitional groove, thereby covering the recessed portion with the packing film. Meanwhile, the presence of the transitional groove can prevent the packing film from being broken, thereby maintaining integrity of the packaging film and improving the packaging effect.

In the above technical solution of the present disclosure, the recessed portion is formed in the insulating layer that is below the OLED, and at least one part of the recessed portion has a shape that is smaller in top and larger in bottom, so as to enable the OLED to break at the wall of the hole in the recessed portion. When forming the through hole that extends through the whole substrate in the region where the recessed portion is located, the packing film that covers the OLED and the recessed portion, can block the water and oxygen from entering the first portion at the surface of the insulating layer from the lateral side of the OLED. Since the first portion is the effective light emitting area of the OLED, the purpose for preventing the performance of the OLED to be affected by the water and oxygen can be achieved.

In one specific embodiment, referring to FIG. 5 and FIG. 6, in order to form the recessed portion 5 having the above shape in the insulating layer 1, the insulating layer 1 may be a composite structure including an inorganic insulation layer 10 and an organic insulation layer 11.

Specifically, the insulating layer 1 includes the inorganic insulation layer 10 and the organic insulation layer 11 formed on a surface of the inorganic insulation layer 10 away from the substrate 100. The inorganic insulation layer 10 is provided with a first opening, and the organic insulation layer 11 is provided with a second opening. The recessed portion 5 is composed of the first opening and the second opening and the first opening and the second opening are corresponding to each other in their positions. An opening size of the first opening is not less than an opening size of the second opening.

In this embodiment, since an etching rate of the inorganic insulation layer is different from an etching rate of the organic insulation layer, the opening size of the first opening in the inorganic insulation layer located below is not less than the opening size of the second opening. Thus, the OLED includes the first portion on the surface of the insulating layer away from the substrate and the second portion at a bottom of the recessed portion, and the recessed portion enables the first portion to be completely disconnected with the second portion.

In this embodiment, in order to simplify the manufacturing process, the insulating layer reuses an existing insulation structure of the organic electroluminescent display substrate.

By taking an active matrix organic electroluminescent display substrate as an example, each pixel region is provided with a thin film transistor. The thin film transistor includes a gate insulating layer. The active matrix organic electroluminescent display substrate further includes a third planarization layer that covers the thin film transistor.

The insulating layer may be composed of the gate insulating layer and the third planarization layer. In other words, the inorganic insulation layer is the gate insulating layer, and the organic insulation layer is the third planarization layer. The recessed portion extends through the third planarization layer and the gate insulating layer. The recessed portion is composed of the first opening in the gate insulating layer and the second opening in the third planarization layer. The first opening and the second opening are corresponding to each other in their positions. An opening size of the first opening is not less than an opening size of the second opening.

For the active matrix organic electroluminescent display substrate, each pixel region is provided with a thin film transistor and an OLED. The OLED includes: a bottom electrode electrically coupled with a drain electrode of a corresponding thin film transistor; a top electrode on one side of the bottom electrode away from the substrate; and a light emitting layer between the bottom electrode and the top electrode.

When the top electrode is a plate electrode covering the entire display substrate, the orthographic projection of the recessed portion on the substrate is surrounded by an orthographic projection of the top electrode and the light emitting layer of the organic electroluminescent component on the substrate. That is, the top electrode and the light emitting layer break at a wall of the hole in the recessed portion. Then, when forming the through hole that extends through the whole display substrate in the region where the recessed portion is located, the packing film that covers the recessed portion, and disconnection of the OLED at the recessed portion, can block the water and oxygen from entering the first sub-portion of the light emitting layer at the surface of the insulating layer and the second sub-portion of the top electrode at the surface of the insulating layer, thereby ensuring performance of the device.

Referring to FIG. 11 and FIG. 12, in one embodiment, in order to improve effect of blocking water and oxygen, at least one annular notch 7 is provided in the insulating layer 1. The notch 7 is disposed at an outer periphery of the recessed portion 5. In the direction perpendicular to the substrate 100, a width of one side of at least one part of the notch 7 away from the substrate 100 is not greater than a width of another side of the at least one part of the notch 7 adjacent the substrate 100. The packing film further covers the notch 7. The OLED further includes a third portion (not shown) in the notch 7. The at least one part of the notch 7 enables the first portion of the OLED to be completely disconnected with the third portion.

In the above technical solution, at least one annular notch is disposed around the outer periphery of the recessed portion and at least one part of the notch has a shape that is smaller in top and larger in bottom, so that the OLED further includes the third portion in the notch and the first portion of the OLED at the surface of the insulating layer is completely disconnected with the third portion. Then, the packing film that covers the notch and the recessed portion, and disconnection of the OLED at the notch and the recessed portion, can form several blocking structures, thereby effectively blocking the water and oxygen from entering the first portion of the OLED from one lateral side of the OLED.

Further, the organic electroluminescent display substrate further includes a second planarization layer filed in the notch. A transitional notch is provided in the second planarization layer in such a manner that a width of one side of the transitional notch away from the substrate is greater than a width of another side of the transitional notch adjacent the substrate.

The packing film specifically covers the transitional notch, thereby covering the notch.

In the above technical solution, by filing the second planarization layer in the notch and forming the transitional notch which is larger in top and smaller in bottom in the second planarization layer, thereby facilitating realization of covering the transitional notch with the packing film and then covering the notch with the packing film. Specific structure is the same as filling the first planarization layer in the recessed portion and forming the transitional groove in the first planarization layer, and is not shown in the drawings.

Referring to FIG. 3 and FIG. 4, by taking the active matrix organic electroluminescent display substrate as an example, the organic electroluminescent display substrate according to one embodiment specifically includes:

a substrate 100;

thin film transistors 110 on the substrate 100; where each pixel region of the active matrix organic electroluminescent display substrate is provided with the thin film transistor 110, and the thin film transistor 110 includes a gate electrode 1102, a gate insulation layer 10, an active layer 1104, a source electrode 1106 and a drain electrode 1108;

a third planarization layer 11 that covers the thin film transistors;

a recessed portion 5 that extends through the third planarization layer 11 and the gate insulation layer 10; where the recessed portion 5 is composed of a first opening 52 in the gate insulation layer 10 and a second opening 52 in the third planarization layer 11, the first opening 52 and the second opening 54 are corresponding to each other in their positions, and an opening size of the first opening 52 is not less than an opening size of the second opening 54;

an OLED at the third planarization layer 11; where each pixel region of the active matrix organic electroluminescent display substrate is provided with the OLED, and the OLED includes: a bottom electrode 20 on the third planarization layer 11, a light emitting layer on the bottom electrode 20, a top electrode on the light emitting layer; the bottom electrode 20 is electrically coupled with the drain electrode 1108 of the thin film transistor 110; an orthographic projection of the recessed portion on the substrate 100 is surrounded by an orthographic projection of the light emitting layer and the top electrode on the substrate 100, i.e., the light emitting layer and the top electrode of the OLED break at a wall of a hole in the recessed portion; the light emitting layer includes a first sub-portion 21 on the surface of the third planarization layer 11 away from the substrate 100 and a third sub-portion 41 in the recessed portion; the top electrode includes a second sub-portion 22 on the surface of the third planarization layer 11 away from the substrate 100 and a fourth sub-portion 42 in the recessed portion; the first sub-portion 21 is disconnected with the third sub-portion 41, and the second sub-portion 22 is disconnected with the fourth sub-portion 42;

a first planarization layer 30 filed in the recessed portion; where a transitional groove 6 is provided in the first planarization layer 30, an opening size of one side of the transitional groove 6 away from the substrate 100 is greater than an opening size of another side of the transitional groove 6 adjacent the substrate 100, the first sub-portion 21 is disconnected with the third sub-portion 41 via the recessed portion 5 and the first planarization layer 30 filed in the recessed portion 5, and the second sub-portion 22 is disconnected with the fourth sub-portion 42 via the recessed portion 5 and the first planarization layer 30 filed in the recessed portion 5;

a packing film 3 covering the OLED and the transitional groove 6; and a through hole 8 that extends through the whole organic electroluminescent display substrate in a region corresponding to the transitional groove 6.

The though hole 8 may be used to mount hardware, such as a camera, a receiver or a Home key. Disconnection of the OLED at the recessed portion and the packing film covering the transitional groove can block the water and oxygen from entering from the lateral side of the OLED, thereby extending the service life.

Furthermore, the active matrix organic electroluminescent display substrate as shown in FIG. 3 and FIG. 4 may be divided into a display region, a transitional region and a through hole. According to the above division, the active matrix organic electroluminescent display substrate as shown in FIG. 3 and FIG. 4 may include: a substrate 100, a display region 200, a transitional region 300, a packing film 3 that extends from the display region 200 to the transitional region 300, and a through hole 8. The transitional region 300 is between the display region 200 and the through hole 8, and the through hole 8 extends through the packing film 3 and the substrate 100. It should be noted that the display region 200 refers to components for displaying on the substrate 100, and the transitional region 300 refers to components that are located on the substrate 100 between the display region 200 and the through hole 8. In addition, the through hole 8 may also be regarded as in the transitional region 300.

Specifically, the display region 200 includes:

thin film transistors 110 on the substrate 100; where the thin film transistor 110 includes a gate electrode 1102, a gate insulation layer 10, an active layer 1104, a source electrode 1106 and a drain electrode 1108;

a third planarization layer 11 that covers the thin film transistors; and an OLED on the third planarization layer 11; where the OLED includes a bottom electrode 20 on the third planarization layer 11, a light emitting layer (i.e., the above first sub-portion 21) on the bottom electrode 20, a top electrode (i.e., the above second sub-portion 22) on the light emitting layer; the bottom electrode 20 is electrically coupled with the drain electrode 1108 of the thin film transistor 110.

The transitional region 300 includes:

a recessed portion 5 that extends through the third planarization layer 11 and the gate insulation layer 10; where the recessed portion 5 is composed of a first opening 52 in the gate insulation layer 10 and a second opening 52 in the third planarization layer 11, the first opening 52 and the second opening 54 are corresponding to each other in their positions, and an opening size of the first opening 52 is not less than an opening size of the second opening 54;

a redundant layer or a dummy layer (i.e., the above second portion 4) on the substrate 100 and in the recessed portion 5; where the redundant layer and at least one layer of the OLED are made of the same material, for example, the redundant layer may include a first layer (i.e., the above third sub-portion 41) on the substrate 100 and a second layer (i.e., the above fourth sub-portion 42) stacked on the first layer; the first layer and the light emitting layer (i.e., the above first sub-portion 21) may be made of the same material and disconnected from each other, and the second layer and the top electrode (i.e., the above second sub-portion 22) may be made of the same material and disconnected from each other; and a first planarization layer 30 filed in the recessed portion 5; where the first planarization layer 30 disconnects the first layer from the light emitting layer, and disconnects the second layer from the top electrode.

In addition, a transitional groove 6 is provided in the first planarization layer 30. An opening size of one side of the transitional groove 6 away from the substrate 100 is greater than an opening size of another side of the transitional groove 6 adjacent the substrate 100.

The packing film 3 extends from the display region 200 to the transitional region 300. Specifically, the packing film 3 covers the OLED, the first planarization layer 30 and the transitional groove 6.

The through hole 8 extends through the whole organic electroluminescent display substrate in a region corresponding to the transitional groove 6. In one embodiment shown in FIG. 3 and FIG. 4, the through hole 8 sequentially extends through the packing film 3, the redundant layer and the substrate 100 from up to bottom.

One embodiment further provides a display device that includes the above organic electroluminescent display substrate, which can block water and oxygen from entering an effective light emitting area of the OLED from a lateral side of the OLED when forming an installation hole (i.e., a through hole) that extends through the whole display substrate in a region where an organic electroluminescent component is located, thereby extending service life of products and improving quality of the products. The display device further includes a camera 310 (as shown in FIG. 4) disposed in the through hole 8 in the organic electroluminescent display substrate.

The display device may be any product or component having a display function, such as an OLED panel, a mobile phone, a tablet computer, a television, a monitor, a notebook computer, a digital photo-frame, and a navigator.

The technical solution of the present disclosure is especially suitable for one flexible display device that can realize a narrow bezel display device or even one bezel-less display device, as the narrow bezel display device or bezel-less display device requires for setting an installation hole into a display region, i.e., the installation hole in a region where the organic electroluminescent is located.

The above are merely the optional embodiments of the present disclosure. It should be noted that, a person skilled in the art may make improvements and modifications without departing from the principle of the present disclosure, and these improvements and modifications shall also fall within the scope of the present disclosure.

What is claimed is:

1. An organic electroluminescent display substrate comprising:
    a substrate;
    a display region;
    a transitional region;
    a packing film that extends from the display region to the transitional region; and
    a through hole;
    wherein the transitional region is between the display region and the through hole;
    wherein the display region includes: an insulating layer on the substrate; and an organic electroluminescent component on the insulating layer;
    wherein the transitional region includes:
    a recessed portion that extends through the insulating layer; wherein an opening size of the recessed portion at a first height above the substrate is not greater than an opening size of the recessed portion at a second height above the substrate; and a redundant layer on the substrate and in the recessed portion; wherein the redundant layer and at least one layer of the organic electroluminescent component are made of a same material, and the redundant layer is disconnected from the organic electroluminescent component;

wherein the packing film covers the organic electroluminescent component and at least one part of the recessed portion; and wherein the through hole extends through the packing film, the redundant layer and the substrate in a region where the recessed portion is located.

2. The organic electroluminescent display substrate of claim 1, wherein the organic electroluminescent component includes: a bottom electrode on the insulating layer, a light emitting layer on the bottom electrode, and a top electrode on the light emitting layer;

wherein the display region further includes:

a thin film transistor on the substrate; wherein the thin film transistor includes a gate electrode, a gate insulation layer covering the gate electrode, an active layer on the gate insulation layer, a source electrode and a drain electrode; and a third planarization layer that is on the gate insulation layer and covers the thin film transistor;

wherein the bottom electrode is electrically coupled with the drain electrode of the thin film transistor.

3. The organic electroluminescent display substrate of claim 2, wherein the gate insulation layer and the third planarization layer form the insulating layer; the recessed portion is composed of a first opening in the gate insulation layer and a second opening in the third planarization layer; in a direction perpendicular to the substrate, the first opening at least partially overlaps the second opening; and an opening size of the first opening is not less than an opening size of the second opening.

4. The organic electroluminescent display substrate of claim 3, wherein the redundant layer includes a first layer on the substrate and a second layer stacked on the first layer; the first layer and the light emitting layer are made of the same material and disconnected from each other; and the second layer and the top electrode are made of the same material and disconnected from each other.

5. The organic electroluminescent display substrate of claim 4, wherein the through hole sequentially extends through the packing film, the second layer, the first layer and the substrate.

6. The organic electroluminescent display substrate of claim 5, wherein the though hole is a cylindrical hole of equal diameter from bottom to top.

7. The organic electroluminescent display substrate of claim 4, wherein the transitional region further includes: a first planarization layer filling in the recessed portion; and the first planarization layer separates the first layer from the light emitting layer, and separates the second layer from the top electrode.

8. The organic electroluminescent display substrate of claim 7, wherein the first planarization layer covers only one portion of the second layer; the first planarization layer is provided with a transitional groove; an opening size of the transitional groove at a third height above the substrate is greater than an opening size of the transitional groove at a fourth height less than the third height above the substrate; and the packing film covers the organic electroluminescent component, the first planarization layer, the transitional groove and one portion of the second layer that is not covered by the first planarization layer.

9. The organic electroluminescent display substrate of claim 8, wherein the packing film is in direct contact with the organic electroluminescent component, the packing film is in direct contact with the first planarization layer, and the packing film is in direct contact with one portion of the second layer that is not covered by the first planarization.

10. The organic electroluminescent display substrate of claim 8, wherein the through hole extends through the whole organic electroluminescent display substrate in a region where the transitional groove is located.

11. The organic electroluminescent display substrate of claim 10, wherein an orthographic projection of the through hole on the substrate is completely within an orthographic projection of the transitional groove on the substrate; and a boundary of the orthographic projection of the through hole on the substrate does not overlap a boundary of the orthographic projection of the transitional groove on the substrate.

12. The organic electroluminescent display substrate of claim 8, wherein a slope degree of the first planarization layer is between 30 degrees and 90 degrees.

13. The organic electroluminescent display substrate of claim 3, wherein the gate insulation layer is an inorganic insulation layer, and the third planarization layer is an organic insulation layer.

14. The organic electroluminescent display substrate of claim 3, wherein the transitional region further includes:

at least one notch disposed at an outer periphery of the recessed portion; wherein in a direction perpendicular to the substrate, a width of the notch at the first height above the substrate is not greater than a width of the notch at the second height less than the first height above the substrate; and a redundant layer on the substrate and in the notch; wherein the redundant layer in the notch and at least one layer of the organic electroluminescent component are made of the same material, and the redundant layer in the notch is disconnected from the organic electroluminescent component;

wherein the packing film covers the notch.

15. The organic electroluminescent display substrate of claim 14, wherein the notch is an annular notch; and the annular notch is disposed around the outer periphery of the recessed portion.

16. The organic electroluminescent display substrate of claim 14, wherein the transitional region further includes: a second planarization layer filling in the notch; the second planarization layer is provided with a transitional notch; the transitional notch is disposed at an outer periphery of the recessed portion; a width of the transitional notch at a third height above the substrate is greater than a width of the transitional notch at a fourth height less than the third height above the substrate; and the packing film covers the transitional notch.

17. A display device comprising the organic electroluminescent display substrate of claim 1.

18. The display device of claim 17, further comprising at least one of a camera, a sensor and a receiver in the through hole of the organic electroluminescent display substrate.

19. A method for manufacturing an organic electroluminescent display substrate, comprising:

forming an insulating layer on a substrate and forming a recessed portion in the insulating layer; wherein an opening size of the recessed portion at a first height above the substrate is not greater than an opening size of the recessed portion at a second height less than the first height above the substrate; and forming an organic electroluminescent component on the insulating layer and simultaneously forming a redundant layer on the substrate and in the recessed portion; wherein the redundant layer and at least one layer of the organic electroluminescent component are made of the same material, and the redundant layer is disconnected from the organic electroluminescent component;

forming a packing film that covers the organic electroluminescent component and at least one part of the recessed portion.

20. The method of claim 19, further comprising: forming a through hole that sequentially extends through the packing film, the redundant layer and the substrate in a region where the recessed portion is located.

* * * * *